United States Patent
Merriss et al.

[11] Patent Number: 6,166,608
[45] Date of Patent: Dec. 26, 2000

[54] THERMO-ELECTRIC COOLED OVEN CONTROLLED CRYSTAL OSCILLATOR

[75] Inventors: Morley M. Merriss, Montara; George P. Zampetti, Livermore, both of Calif.

[73] Assignee: Symmetricom, Inc., San Jose, Calif.

[21] Appl. No.: 09/176,128

[22] Filed: Oct. 21, 1998

[51] Int. Cl.$^7$ ...................................................... H03B 1/00
[52] U.S. Cl. ............................ 331/69; 331/158; 331/176
[58] Field of Search .............................. 331/69, 176, 158, 331/65, 66

[56] References Cited

U.S. PATENT DOCUMENTS

| | | | |
|---|---|---|---|
| 4,893,097 | 1/1990 | Zwack | ...................................... 331/176 |
| 5,729,181 | 3/1998 | Cutler et al. | ............................... 331/69 |

*Primary Examiner*—Robert Pascal
*Assistant Examiner*—Kimberly E Glenn
*Attorney, Agent, or Firm*—Wilson, Sonsini, Goodrich & Rosati

[57] ABSTRACT

The present invention is a stabilized oscillator system comprising an oven controlled crystal oscillator positioned inside an insulated housing. Within the insulated housing, there is a cold plate in thermal contact with the oven controlled crystal oscillator and a thermo-electric cooler in contact with the cold plate. A heat sink external to the insulated housing is in thermal contact with the thermo-electric cooler. The thermo-electric cooler pumps heat into or out of the oven controlled crystal oscillator through the cold plate and into or out of the heat sink. The thermo-electric cooler is controlled as part of a feedback loop which attempts to stabilize the output frequency of the oven controlled crystal oscillator.

18 Claims, 4 Drawing Sheets

Thermo-electric Cooler Driver

OCXO Set point = 110ma
Proportional Gain = 0.1
Integral Gain = 0.05
Temperature Profile = 65°C ->8hrs-> 0°C->8hrs->65°C
Aging Compensation = .000633 x $10^{-10}$/sample

THERMO-ELECTRIC COOLED OVEN CONTROLLED CRYSTAL OSCILLATOR

FIELD OF THE INVENTION

The invention relates to a method and apparatus for controlling the oscillation of crystals and in particular to stabilizing the output frequency of crystal oscillators.

DESCRIPTION OF RELATED ART

Oscillators of all types have long been used as frequency references for a variety of applications. In particular, crystal oscillators, due to their relatively small size, low power consumption, and reasonable stability, are preferred for numerous applications. However, the output frequency of a crystal oscillator varies with temperature and so these oscillators must therefore operate in a temperature controlled environment in order to achieve high frequency stability. A common technique used to control the ambient temperature of a crystal oscillator is to put the crystal in a temperature controlled oven.

A typical oven controlled crystal oscillator (OCXO) consists of a crystal based oscillator and temperature control system and support circuitry surrounded by a layer of thermal insulation enclosed in a sealed metal can. Inside, the crystal is kept at a fixed temperature between 70° C. to 90° C., based on the turnover point of the crystal where the frequency vs. temperature response is nominally flat.

Most temperature control systems are based on a thermistor/error amplifier/semiconductor heater design. In order to maintain a constant temperature within the oven, there must be a balance of power input to the oven with heat flowing out of the oven.

However, as the temperature differential between the crystal and the outside world approaches 0, heat is less efficiently dissipated through the insulation. When the temperature outside the OCXO is close enough to the temperature inside the oven, the oven will turn off completely. Typically, since there is some finite energy input to the control and oscillator system (e.g., ¼ to ½ watt), the maximum ambient temperature at which the oven will operate may be several degrees (e.g., about 10° C.) below the set point for the oven.

One approach that has been used to achieve even higher frequency stability than the OCXO is the double oven controlled crystal oscillator (DOCXO). DOCXOs are similar in design to the OCXO, with an additional outer oven wrapped around the internal OCXO. The outer oven means that DOCXOs have an additional layer of insulation over which the power input must balance the heat dissipation, resulting in another drop in maximum ambient temperature at which the oven will operate. Most DOCXOs use higher temperature set points, which increases aging, and compensate for this by using 3rd or 5th overtone crystals. This can cause a DOCXO to be bigger and require more power to operate.

What is needed is a controlled crystal oscillator that can achieve high frequency stability at a lower crystal temperature with low power consumption and in a small package while reducing the need for crystal ovens.

SUMMARY OF THE INVENTION

One embodiment of the present invention is a stabilized oscillator system comprising an oven controlled crystal oscillator positioned inside an insulated housing. Within the insulated housing, there is a cold plate in thermal contact with the oven controlled crystal oscillator and a thermo-electric cooler in contact with the cold plate. A heat sink external to the insulated housing is in thermal contact with the thermo-electric cooler. The thermo-electric cooler pumps heat into or out of the oven controlled crystal oscillator through the cold plate and into or out of the heat sink. In one aspect of the invention, the thermo-electric cooler is part of a feedback loop which attempts to stabilize the output frequency of the oven controlled crystal oscillator.

Another embodiment of the present invention is a stabilized oscillator system comprising a crystal oscillator, a control device which monitors a characteristic of the crystal oscillator and generates a control signal related to the characteristic of the crystal oscillator and a set point for the characteristic of the crystal oscillator, and a device that pumps heat into and out of the crystal oscillator in response to the control signal to move the characteristic of the crystal oscillator towards the set point for the characteristic of the crystal oscillator. The device is thermally coupled to the crystal oscillator and electrically coupled to the control device. In one aspect of the invention, the device includes a thermo-electric cooler. In another embodiment, the stabilized oscillator system also includes a cold plate, the cold plate being thermally coupled to the crystal oscillator and thermally coupled to the thermo-electric cooler. The stabilized oscillator system further includes a heat sink, the heat sink being thermally coupled to the thermo-electric cooler. In another aspect of the invention, the crystal oscillator includes an oven controlled crystal oscillator.

In another embodiment, the control device includes a processor, an input device which inputs the current consumption signal into the processor, and an output device which controls the device that pumps heat into and out of the crystal oscillator, the output device being coupled to the processor.

Another embodiment of the invention is a method for stabilizing a crystal oscillator, the method comprising monitoring a characteristic of the oscillator, generating a control signal based on the characteristic of the oscillator, and controlling heat flow between the oscillator and a heat reservoir based on the control signal in order to stabilize the frequency of the oscillator. In one aspect of this embodiment, the characteristic includes a power consumption of the oscillator or a temperature of the oscillator. In another aspect of the invention, controlling heat flow includes actively transferring heat from the heat reservoir to the oscillator.

Yet another embodiment of the invention is a stabilized oscillator system comprising an oven controlled crystal oscillator, an insulated housing, the insulating housing at least partially surrounding the oven controlled crystal oscillator. A cold plate is thermally coupled to the oven controlled crystal oscillator, a thermo-electric cooler is thermal coupled to the oven controlled crystal oscillator, and a heat sink is thermally coupled to the thermo-electric cooler. A monitoring device outputs a monitor signal. The monitoring device is electrically coupled to the oven controlled crystal oscillator. A processor is coupled to the monitoring device and configured to receive the monitor signal, and a thermo-electric cooler driver is coupled to the processor and the thermo-electric cooler.

DETAILED DESCRIPTION

The following description is presented to enable a person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the invention. Thus, the present invention is not intended to be limited to the embodiments disclosed, but is to be accorded the widest scope consistent with the principles and features disclosed herein.

Figure 1:
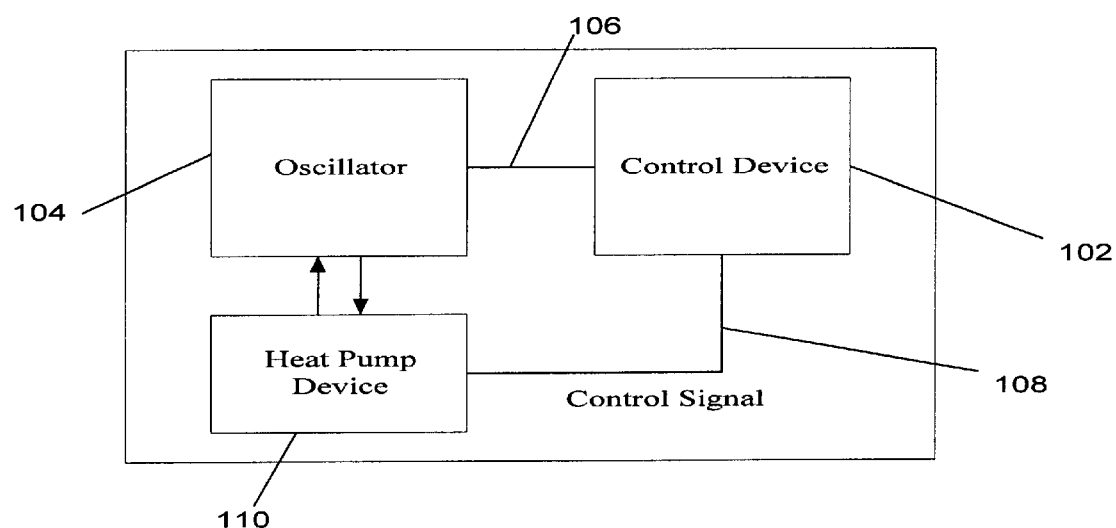
FIG. 1 depicts one embodiment of the invention in which the temperature of an oscillator is controlled by the control device in a feedback loop.

FIG. 1 depicts an embodiment of the present invention. In this embodiment control device 102 monitors a characteristic of crystal oscillator system 104 through monitor connection 106. Control device 102 can be any control circuitry implemented in any technology including but not limited to dedicated logic, a digital signal processor, a programmable gate array, a neural network, analog circuitry, an analog computer, or a central processor unit implemented in any other technology, or a computer or a computer system such as a microprocessor-based system, a mainframe system, or any other type of general or special purpose computer. Control device 102 could monitor any characteristic of crystal oscillator system 104 which varies with the frequency output by crystal oscillator system 104. Characteristics which can be monitored include but are not limited to a power, a current, and/or a voltage input into crystal oscillator system 104, and/or a temperature of crystal oscillator system 104. Crystal oscillator system 104 can be any type of crystal oscillator, including but not limited to a voltage controlled crystal oscillator (VCXO), a temperature compensated crystal oscillator (TCXO), an oven controlled crystal oscillator, or a double oven controlled crystal oscillator.

Control device 102 generates a control signal related to one or more monitored characteristics of crystal oscillator system 104. The control signal can be generated in a variety of ways, including but not limited to comparing the monitored signal to a measured or calculated reference signal or set point. The measured or calculated set point or reference signal can be obtained from one or more of, but is not limited to, the monitored characteristic, user supplied input, and other external input, and it may vary with time. Examples of possible set points include a set point for the current input into the crystal, or a lookup table for the current input to the crystal which varies as a function of time and operating temperature of the crystal.

The control signal generated by control device 102 is input through control signal line 108 into heat pump device 110. Heat pump device 110 can be, but is not limited to, one or more thermo-electric coolers and drivers, or semiconductor heaters. The control signal controls heat pump device 110 to pump heat into or out of crystal oscillator system 104.

The output of crystal oscillator system 104 can be used as a frequency reference for a variety of applications. Embodiments of the present invention are particularly well suited to applications requiring low cost, small size, and/or high stability or immunity to ambient temperature changes. Applications include but are not limited to use as a frequency reference in a Primary Reference Source, Global Positioning or other radio-based navigation and timing system, digital telephone switch, cross-connect or multiplexer, or cellular telephone base station, handset, or supporting cellular system network elements.

Figure 2A:
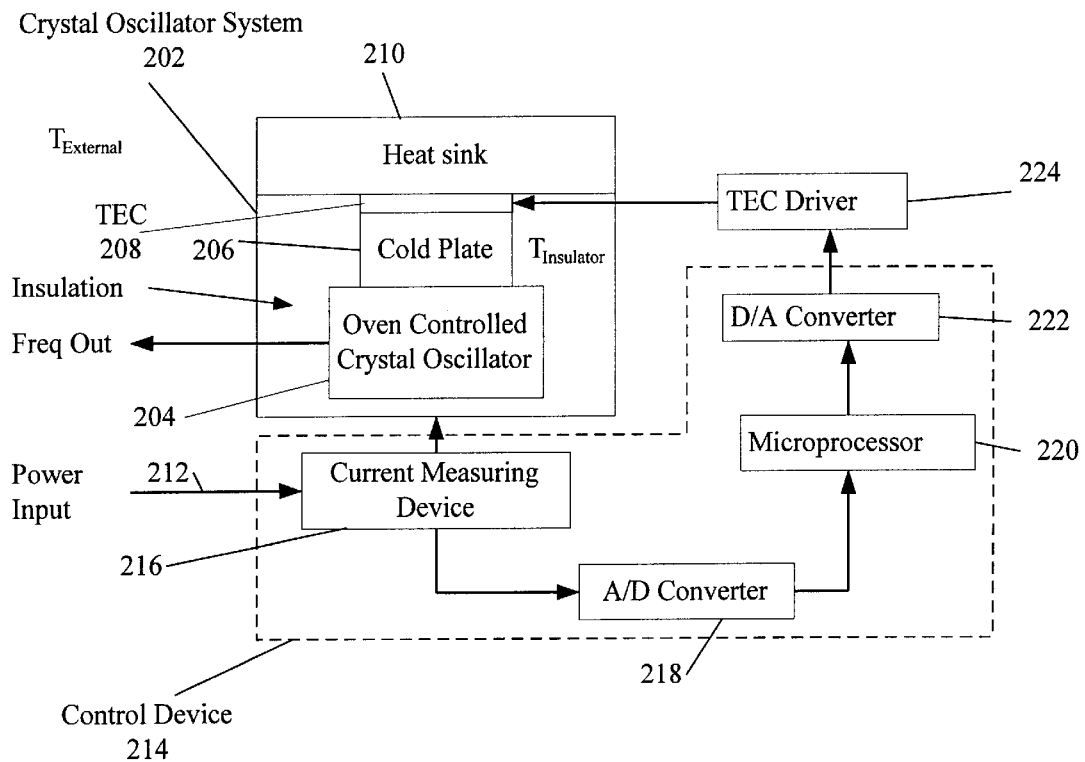
FIG. 2A depicts an embodiment of the invention in which the current consumed by an oven controlled crystal oscillator is used as part of a feedback loop to control the heat pumped into or out of the crystal by a thermo-electric cooler.

FIG. 2A depicts yet another embodiment of the invention. In this embodiment crystal oscillator system 202 is comprised of oven controlled crystal oscillator 204 in thermal contact with optional cold plate 206. Thermo-electric cooler 208 is in thermal contact with cold plate 206 and heat sink 210. Oven controlled crystal oscillator 204, cold plate 206, thermo-electric cooler 208 and heat sink 210 are all at least partially enclosed in insulation or an insulated housing. Although the embodiment of FIG. 2A depicts crystal oscillator system 202 with cold plate 206, other embodiments of the invention do not have cold plate 206. In these embodiments oven controlled crystal oscillator 204 is placed in thermal contact with thermo-electric cooler 208 without cold plate 206 in between.

In this embodiment, control device 214 includes current measuring device 216, analog-to-digital converter 218, microprocessor 220, and digital-to-analog converter 222. It would not depart from the present invention if control device 214 contained only a microprocessor, or a computer, or any other device or system which could generate the feedback signal to operate the thermo-electric cooler based on a monitored characteristic of a crystal input.

Oven controlled crystal oscillator 204 is powered though power input 212. Current measuring device 216 is connected to input analog-to-digital converter 218. Analog-to-digital converter 218 is connected to microprocessor 220 which is connected to output digital-to-analog converter 222. Digital-to-analog converter 222 is connected to thermo-electric cooler driver 224 which is connected to thermo-electric cooler 208. Thermo-electric cooler driver 224 may be omitted if digital-to-analog converter 222, or microprocessor 220 can drive thermo-electric cooler 208 directly.

During operation of crystal oscillator system 202, heat from oven controlled crystal oscillator 204 flows out to the surrounding parts of crystal oscillator system 202, and then out into the surrounding environment. Thus, as the ambient or external temperature, $T_{external}$, changes, the rate at which heat flows out of crystal oscillator system 202 varies, resulting in a variation of $T_{insulator}$. Changes in $T_{insulator}$ affect the rate at which heat flows out of oven controlled crystal oscillator 204. The temperature controller in oven controlled crystal oscillator 204 will attempt to maintain the crystal at a constant temperature. However, as discussed above, typical oven controlled crystal oscillators cannot maintain the internal temperature absolutely constant as the temperature external to the oven varies and changes the rate at which heat flows into or out of the oven. In this embodiment of the invention, thermo-electric cooler 208 acts to control the rate of heat flow into or out of oven controlled crystal oscillator 204, even if $T_{insulator}$ changes. This helps to stabilize the temperature of oven controlled crystal oscillator 204 against changes in $T_{external}$.

In the embodiment of FIG. 2A, power is input into oven controlled crystal oscillator 204 through input 212. Current measuring device 216 measures the current supplied to oven controlled crystal oscillator 204 and generates a current measurement signal which is transmitted to analog-to-digital converter 218. Analog-to-digital converter 218 generates a digital signal related to the current measured by current measuring device 216. Analog-to-digital converter 218 is not required if current measuring device 216 directly outputs a digital signal, or if a digital signal is not required in control device 214.

The output of analog-to-digital converter 218 is fed into microprocessor 220. Microprocessor 220 can be part of, but is not limited to, any type of analog or digital controller, computer or computer system including a personal computer. In one embodiment of the invention, the digital signal related to the current is compared to a set point for the current stored in microprocessor 220 and a control signal is generated to drive the digital signal related to the current towards the set point for the current.

The control signal is output from microprocessor 220 into digital-to-analog converter 222 which converts the control signal into a form suitable to operate thermo-electric cooler driver 224. Digital-to-analog converter 222 can be omitted if microprocessor 220 directly generates a signal suitable to operate thermo-electric cooler driver 224 or the thermo-electric cooler itself. Thermo-electric cooler driver 224 drives thermo-electric cooler 208 to pump heat into or out of cold plate 206, adjusting the rate at which heat flows into or out of oven controlled crystal oscillator 204. In this manner thermo-electric cooler 208 attempts to adjust the current consumed by oven controlled crystal oscillator 204 towards the set point stored in microprocessor 220.

In other embodiments of the invention, the set point is a constant value or is varied based on information stored within the microprocessor, or based on external information, or it can be adaptively adjusted, for example, in proportion to the amount of heat or rate of change of heat being pumped in or out by the thermo-electric cooler, or a comparison between the frequency output of the oscillator and an external reference. In one of these embodiments, a traceable external reference such as a Global Positioning satellite signal is compared to the frequency output of the oscillator and an error signal is generated. The error signal is then used to adjust the set point in an attempt to reduce the error signal. Suitable systems for performing the comparison include but are not limited to a frequency counter, phase/time measurement devices including those described in U.S. Pat. NO. 5,646,519, which is fully incorporated herein by reference, or a time measurement system including systems described in U.S. Pat. No. 5,751,777, which is fully incorporated herein by reference.

Example

One embodiment of the invention was constructed using the layout depicted in FIG. 2A. The oven controlled crystal oscillator used was a 20 Megahertz OAK SC cut surface mounted oven controlled crystal oscillator (SMOCXO), which was 1 inch by 1 inch by 0.5 inches, runs on a 5 volt power supply and consumes 65 milliamps at 60° C., 110 milliamps at 40° C., and 200 milliamps at 0° C. The power supply sensitivity of the SMOCXO is $10^{-9}$/%, the small signal sensitivity at 40° C. is $6 \times 10^{-11}$/C, the overall stability between 0° C. and 60° C. is +/−10−8, its thermal time constant is 100 seconds, and its supply current sensitivity is 2 milliamps/° C. A Melcor CP1.0-17-05L thermo-electric cooler was used.

Figure 2B:
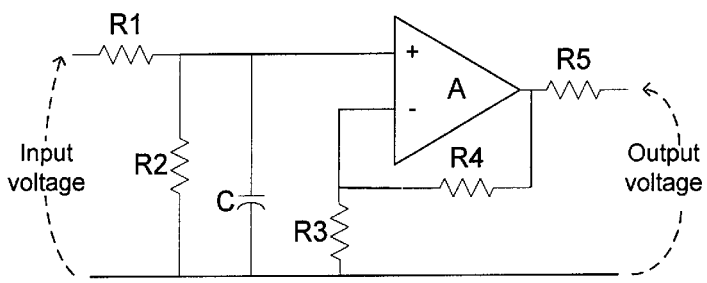
FIG. 2B depicts the embodiment of a thermo-electric cooler driver used to operate a thermo-electric cooler for the system depicted in FIG. 2A.

The thermo-electric driver used is depicted in FIG. 2B. For this driver, A was a National Semiconductor LM1875T connected to dual +/−15 volt DC power supplies which are not depicted; C was a 0.1 microfarad capacitor; and R1, R2, R3, R4, and R5 were, respectively, 20 kΩ, 1 kΩ, 1 kΩ, 10 kΩ, and 4 Ω resistors.

A Stanford Research Systems SRS620 Time Interval Counter was used as a combination analog-to-digital converter for the oscillator input current measurements, and a digital-to-analog converter for driving the thermo-electric cooler driver. A personal computer running a program in C++ computed the current error signal and generated the appropriate signal for the thermo-electric cooler driver. The computer controlled the SRS620 through an RS232 port. The thermo-electric cooler control signal was generated using a second order controller with a proportional and integral term operating on the error of the OCXO current. The feedback loop operates as follows: the OCXO current is read once a second and these samples are averaged to obtain an average OCXO current over a 30 second interval. The thermo-electric cooler current is then calculated as follows:

$$\text{TEC Current} = K[\text{OCXO ERROR}] + \text{INTEGRAL}$$

where:

$$\text{INTEGRAL}(t) = \text{INTEGRAL}(t[n-1]) + M(\text{OCXO ERROR})$$

The constants K and M are selected to provide a stable closed loop response. K and M can be determined by measuring the impulse response of the open loop system (e.g. apply Y watts to the thermo-electric cooler, and measure the effect of X milliamps in the OCXO oven over time). These open loop values can then be used as a first approximation of the closed loop values. The control loop is then closed and the values of K and M are then adjusted to optimize the loop. The actual values of K and M are influenced by the units of measure used, and the thermal time constant of the system (100–300 seconds in this example). The only restriction on the time constant is that t must be much smaller than the thermal time constant of the system in order for the loop to be stable. The time steps for this equation is 30 seconds, and K and M were 0.03 and 0.001 respectively.

The OCXO error is derived from the difference between the measured OCXO current and the OCXO set point, where the OCXO setpoint was the desired oven current setpoint for the OCXO. In this example the OCXO was typically between 10–100 milliamps. The OCXO setpoint in practice need only be between 0 and a number related to the maximum thermo-electric cooling at the maximum ambient temperature. Typically it should be kept low since many thermo-electric coolers heat more efficiently than they cool.

Figure 3A:
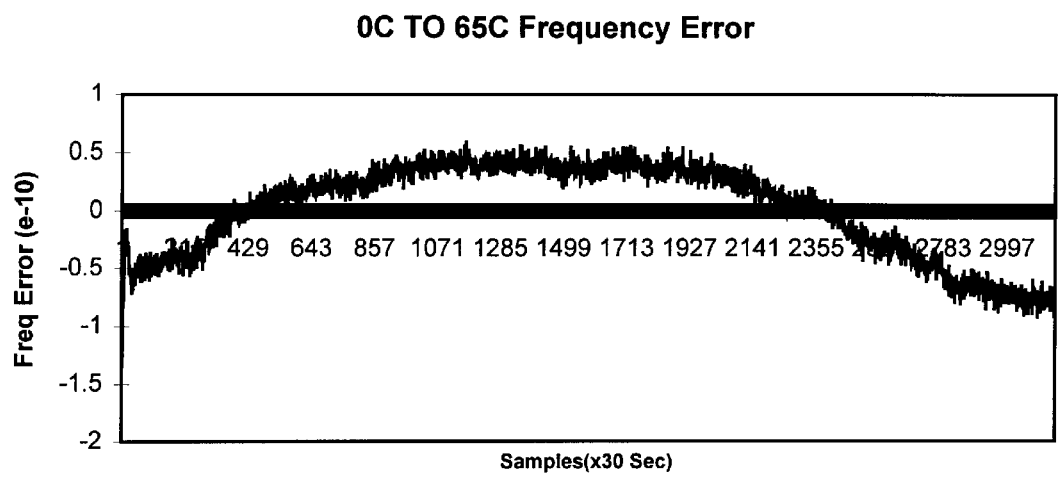
FIG. 3A shows a plot of output frequency of the oscillator versus sample interval for the embodiment of FIG. 2 as the ambient temperature was varied from 10° C. to 65° C. at the rate of 8° C./hour in which the output was compensated for aging.

FIG. 3A shows a plot of output frequency of the oscillator versus sample interval as the ambient temperature was varied from 10° C. to 50° C. at a rate of 8° C./hour, and the output was compensated for aging. Compensation for aging was performed by comparing the output of the OCXO system at the same temperature at different times as depicted in the equation below:

Aging (Frequency/time)=[Frequency(at time X)−Frequency(at time X)]/[time X−time Y]

Figure 3B:
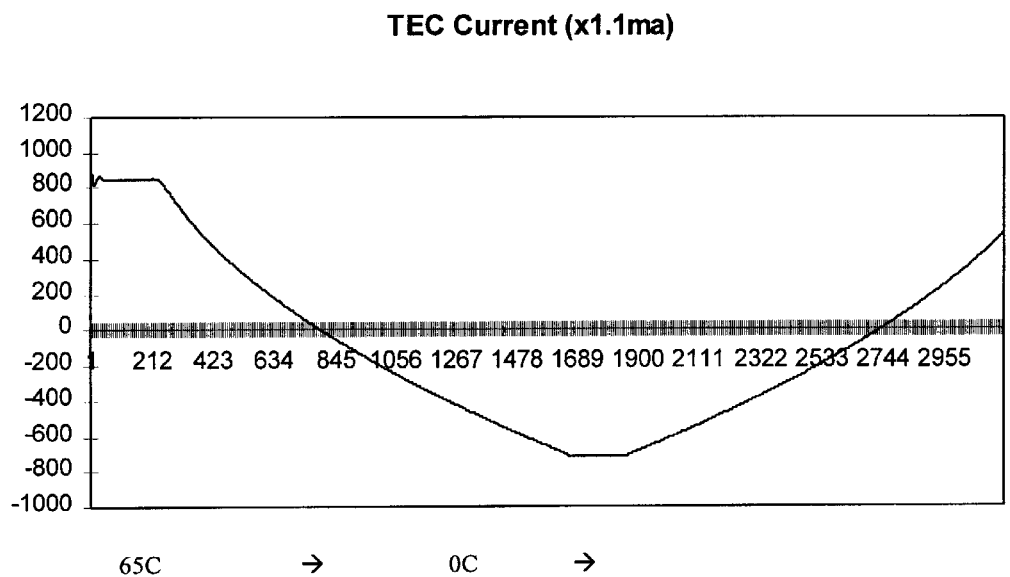
FIG. 3B is a plot of the thermo-electric cooler current in milliamps versus sample interval for the embodiment of FIG. 2.

As can be seen from the graph in FIG. 3A, the frequency varied by less than +/−10−10. FIG. 3B is a plot of the thermo-electric cooler current in milliamps versus sample interval.

Figure 4:
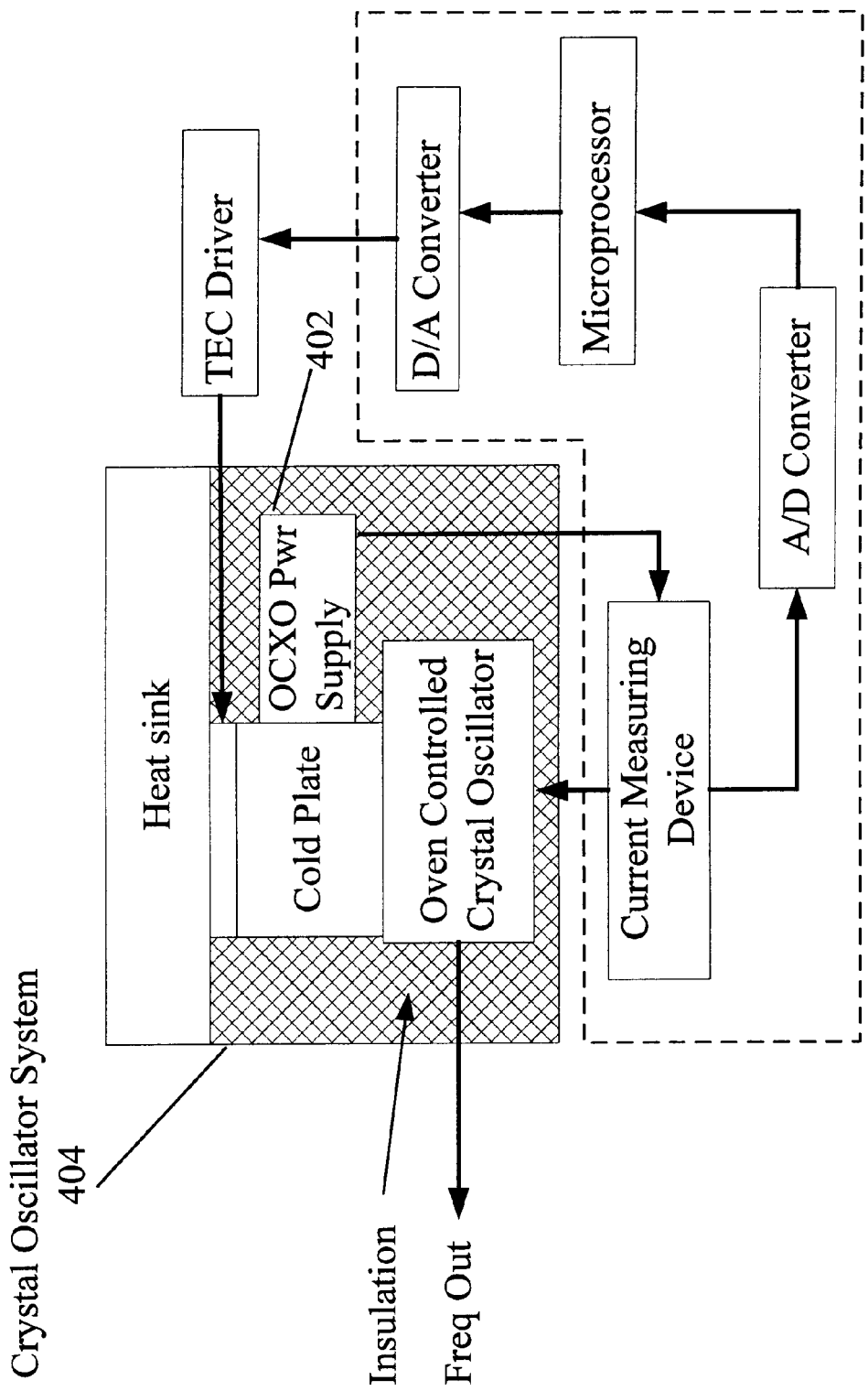
FIG. 4 depicts an embodiment of the invention in which the power supply of the oven controlled crystal oscillator is at least partially temperature stabilized by placing it within the insulated housing of the crystal oscillator system.

FIG. 4 depicts yet another embodiment of the invention. In this embodiment, crystal oscillator power supply 402 is housed inside crystal oscillator system 404. It is noted that variations in the oscillator power supply output, including for example voltage fluctuation, can affect the output frequency of crystal oscillator system 404. In order to avoid fluctuations in the output of a crystal power supply as the ambient temperature of the power supply changes, power supplies are often constructed using expensive low temperature coefficient components. This can significantly increase the price of a power supply.

In the present embodiment, the temperature of power supply 402 is stabilized as a by-product of the feedback loop used to control the frequency of the crystal. This provides an inexpensive, easily implementable technique to reduce the external temperature effects on oscillator power supply 402 and the need for expensive low temperature coefficient components.

The foregoing description of embodiments of the present invention are presented for the purposes of illustration and description only. They are not intended to be exhaustive or to limit the invention to the forms disclosed. Many modifications and variations will be apparent to practitioners skilled in the art. It is intended that the scope of the invention be defined by the following claims and their equivalents.

What is claimed is:

1. A stabilized oscillator system, comprising:
   a crystal oscillator;
   a control device which monitors a characteristic of the crystal oscillator and generates a control signal related to the characteristic of the crystal oscillator and a set point for the characteristic of the crystal oscillator;
   a device that can pump heat out of the crystal oscillator in response to the control signal to move the characteristic of the crystal oscillator towards the set point for the characteristic of the crystal oscillator, the device being thermally coupled to the crystal oscillator, and electrically coupled to the control device, the device including a thermo-electric cooler;
   a cold plate, the cold plate being thermally coupled to the crystal oscillator and thermally coupled to the thermo-electric cooler; and
   a heat sink, the heat sink being thermally coupled to the thermo-electric cooler.

2. The stabilized oscillator system of claim 1, wherein:
   the crystal oscillator includes an oven controlled crystal oscillator.

3. The stabilized oscillator system of claim 2, wherein:
   a crystal oscillator power supply supplies power to a heating device in the oven controlled crystal oscillator.

4. The stabilized oscillator system of claim 1, wherein:
   the crystal oscillator includes an oven.

5. The stabilized oscillator system of claim 1, wherein:
   the characteristic includes a power consumption of the crystal oscillator.

6. The stabilized oscillator system of claim 1, wherein:
   the characteristic includes a current supplied to the crystal oscillator.

7. The stabilized oscillator system of claim 6, wherein:
   the set point for the characteristic includes a current set point.

8. The stabilized oscillator system of claim 1, further comprising:
   a crystal oscillator power supply, the crystal oscillator power supply being coupled to the crystal oscillator.

9. The stabilized oscillator system of claim 1, wherein:
   the control device includes
      a processor,
      an input device which inputs a current consumption signal into the processor; and
      an output device which controls the device that can pump heat out of the crystal oscillator, the output device being coupled to the processor.

10. A method for stabilizing a crystal oscillator, comprising:
    monitoring a characteristic of the crystal oscillator;
    generating a control signal based on the characteristic of the crystal oscillator; and
    controlling heat flow from the crystal oscillator to a heat reservoir based on the control signal in order to stabilize a frequency of the crystal oscillator, wherein
       the characteristic includes a power consumption of the crystal oscillator.

11. A stabilized oscillator system, comprising:
    an oven controlled crystal oscillator;
    an insulated housing, the insulating housing at least partially surrounding the oven controlled crystal oscillator;
    a cold plate thermally coupled to the oven controlled crystal oscillator;
    a thermo-electric cooler thermally coupled to the cold plate;
    a heat sink thermally coupled to the thermo-electric cooler;
    a monitoring device that outputs a monitor signal, the monitoring device being electrically coupled to the oven controlled crystal oscillator;
    a processor, coupled to the monitoring device and configured to receive the monitor signal; and
    a thermo-electric cooler driver coupled to the processor and the thermo-electric cooler,
    wherein the thermo-electric cooler can pump heat from the oven controlled crystal oscillator to the heat sink in response to a processor signal from the processor.

12. The stabilized oscillator system of claim 11, wherein:
    the monitor signal includes a power consumption signal.

13. The stabilized oscillator system of claim 11, wherein:
    the monitor signal includes an electrical current signal.

14. The stabilized oscillator system of claim 11, wherein:
    the monitor signal includes a temperature signal.

15. The stabilized oscillator system of claim 11, further comprising:
    an oscillator power supply, the oscillator power supply being coupled to the oscillator.

16. The stabilized oscillator system of claim 11, further comprising:
    an input device that includes an analog-to-digital converter for inputting the monitor signal into the processor; and
    an output device that includes a digital-to-analog converter for outputting a control signal from the processor to the thermo-electric cooler driver.

17. A stabilized oscillator system, comprising:
    an oscillator;
    a control means, coupled to the oscillator, for generating a control signal related to a characteristic of the oscillator; and
    a heat pump means, coupled to the oscillator, for actively transferring heat from the oscillator to a heat reservoir in response to the control signal,
    wherein:
       the characteristic includes a power consumption of the oscillator.

18. The stabilized oscillator system of claim 17, wherein:
    the oscillator is an oven controlled crystal oscillator.

* * * * *